US008080990B2

(12) United States Patent
Ehret et al.

(10) Patent No.: US 8,080,990 B2
(45) Date of Patent: Dec. 20, 2011

(54) METHOD AND SYSTEM FOR ASCERTAINING OPERATING PARAMETERS OF AN ELECTROCHEMICAL STORAGE BATTERY

(75) Inventors: Christine Ehret, Thalfingen (DE); Daniel Heinze, Magdeburg (DE); Andreas Jossen, Leipheim (DE); Volker Spaeth, Betlinshausen (DE)

(73) Assignee: Robert Bosch GmbH, Stuttgart (DE)

( * ) Notice: Subject to any disclaimer, the term of this patent is extended or adjusted under 35 U.S.C. 154(b) by 1169 days.

(21) Appl. No.: 11/587,230

(22) PCT Filed: Apr. 15, 2005

(86) PCT No.: PCT/EP2005/051669
§ 371 (c)(1),
(2), (4) Date: May 25, 2007

(87) PCT Pub. No.: WO2005/103745
PCT Pub. Date: Nov. 3, 2005

(65) Prior Publication Data
US 2007/0285098 A1    Dec. 13, 2007

(30) Foreign Application Priority Data

Apr. 23, 2004 (DE) .......................... 10 2004 020 412
Apr. 6, 2005 (DE) .......................... 10 2005 015 729

(51) Int. Cl.
*G01N 27/416* (2006.01)
*G01N 27/42* (2006.01)
(52) U.S. Cl. ...................................... 324/132; 324/425
(58) Field of Classification Search .......... 324/425–434; 320/132
See application file for complete search history.

(56) References Cited

U.S. PATENT DOCUMENTS

| 6,127,806 A |   | 10/2000 | Tanjo et al. |
| 6,163,133 A | * | 12/2000 | Laig-Horstebrock et al. ............. 320/132 |

FOREIGN PATENT DOCUMENTS

| DE | 101 06 508 | 8/2002 |
| DE | 102 16 637 | 1/2004 |

(Continued)

OTHER PUBLICATIONS

Sauer, D U, "Modelling of local conditions in flooded lead/acid batteries in photovoltaic systems", Journal of Power Sources, Elsevier, Amsterdam, NL, vol. 64, No. 1-2, Jan. 1996, pp. 181-187.

(Continued)

*Primary Examiner* — Richard V Muralidar
(74) *Attorney, Agent, or Firm* — Kenyon & Kenyon LLP

(57) ABSTRACT

A method for ascertaining operating parameters of an electrochemical storage battery, taking into account electrolyte stratification. The method including a) determining a first functional relationship between no-load voltage and state of charge as a value for the withdrawable charge in relation to nominal capacity of the storage battery, which is obtained in the state having electrolyte stratification in a discharge phase using the charge conversion since a prior no-load phase or pre-charge; b) determining a second functional relationship between no-load voltage and state of charge as a value for the withdrawable charge in relation to nominal capacity of the storage battery, obtained in the state having electrolyte stratification in a discharge phase using an accumulated charge conversion; and c) ascertaining operating parameters from the point of intersection of the first and second functional relationships and/or the slope of straight lines for describing the first and/or second functional relationships.

13 Claims, 5 Drawing Sheets

FOREIGN PATENT DOCUMENTS

| | | |
|---|---|---|
| JP | 11-111348 | 4/1999 |
| JP | 2003-17139 | 1/2003 |
| JP | 2003-77531 | 3/2003 |
| JP | 2010-197395 | 9/2010 |
| WO | WO 03/001224 | 1/2003 |

OTHER PUBLICATIONS

Piller S. et al., "Methods for state-of-charge determination and their applications", Journal of Power Sources, Elsevier, Amsterdam, NL, vol. 96, No. 1, Jun. 1, 2001, pp. 113-120.

* cited by examiner

=> first functional relationship

=> second functional relationship

METHOD AND SYSTEM FOR ASCERTAINING OPERATING PARAMETERS OF AN ELECTROCHEMICAL STORAGE BATTERY

FIELD OF THE INVENTION

The present invention relates to a method for ascertaining operating parameters of an electrochemical storage battery, taking into account electrolyte stratification.

The present invention also relates to a system for ascertaining operating parameters of an electrochemical storage battery having means for determining the battery voltage and the battery current, having a memory for saving the nominal capacity of the storage battery and having computer device.

BACKGROUND INFORMATION

Electrolyte stratification develops in storage batteries, in particular in lead-acid batteries, which are subject to extreme cyclic operation. This occurs to a great extent in particular when the batteries are discharged to a very low level.

In a stratified electrochemical storage battery, electrolyte stratification causes the total capacity of an unstratified storage battery (without electrolyte stratification) to no longer be available.

Modern automotive batteries are also very frequently operated in low states of charge, which cause electrolyte stratification. In luxury vehicles, loads are still active when the vehicle is not running (no-load current of the vehicle) and/or are activated by the driver (auxiliary heating, seat adjustment, TV, etc.). Electrolyte stratification has a very marked effect on the availability of these comfort loads in luxury vehicles. They must be turned off earlier to guarantee preferred functions such as starting the vehicle.

Electrolyte stratification cannot be eliminated completely. However, stratification is greatly decreased by a very high charge, e.g., at 16 V over a very long period of time in the case of a 12 V battery. During vehicle operation, the battery is usually charged at a low voltage (max. 14.7 V) but the battery is discharged to a low level in top-of-the-line vehicles. Raising the charging voltage to 16 V and/or optimizing the charging procedure to reduce the resulting electrolyte stratification is often associated only with an unwanted intervention in the energy management of the vehicle. In such vehicles, the battery is never fully charged, so stratification is not eliminated.

German Patent Application No. DE 101 06 508 A1 describes a method for estimating the efficiency of a storage battery, taking into account electrolyte stratification, from the battery terminal voltage, battery current, and battery temperature. To do so, an internal voltage drop in the battery due to density differences in the battery acid, a no-load voltage, and an internal resistance are estimated and the efficiency is determined by using a model describing the battery.

SUMMARY

An object of the present invention is to create an improved method for ascertaining operating parameters of an electrochemical storage battery, taking into account electrolyte stratification, in particular to determine the acid capacity and thus the ACTUAL capacity of the storage battery still available with the existing stratification in an even simpler and more reliable manner.

This object may be achieved with an example method according to the present invention by the steps:

a) determining a first functional relationship between no-load voltage $U_0$ and state of charge SOC as a value for the withdrawable charge in relation to nominal capacity $Q_N$ of the storage battery, obtained as a state having electrolyte stratification in a discharge phase using the charge conversion since a previous no-load phase or a full charge;

b) determining a second functional relationship between no-load voltage $U_0$ and state of charge SOC as a value for the withdrawable charge in relation to nominal capacity $Q_N$ of the storage battery, obtained as the state having electrolyte stratification in a discharge phase using an accumulated charge conversion;

c) ascertaining operating parameters (e.g., acid capacity, withdrawable charge under nominal conditions, etc.) from the point of intersection of the first and second functional relationships, the slope of straight lines for describing the first and/or second functional relationship(s) and/or from two no-load voltage values and the charge throughput between these no-load voltage values.

This example method is based on the finding that the charge and discharge characteristics of no-load voltage $U_0$ plotted as a function of state of charge SOC in electrolyte stratification have a mutual influence with regard to the corresponding characteristic lines of the storage battery without electrolyte stratification. It has been found that the charge and discharge characteristic lines behave differently. In charging the storage battery, a straight line is obtained as the characteristic line, but the discharge characteristic line is made up of two straight parts having different slopes. The steep straight line in the upper value range of state of charge SOC is referred to as the first functional relationship and a gently sloped straight line in the lower value range of state of charge SOC is referred to as the second functional relationship. The rise of the straight lines and the point of intersection between these functional relationships change in the course of the electrolyte stratification process.

The downward shift in the second characteristic line has an influence on the offset of the first characteristic line and the leftward shift in the first characteristic line has an influence on the offset of the second characteristic line. The characteristic line without stratification is used to determine these offsets between the particular characteristic lines and the characteristic line without stratification.

With the example method according to the present invention, it is now proposed that the change in the point of intersection of the gently sloped straight lines of the discharge characteristic line in the lower value range of the state of charge (second functional relationship) should be analyzed using the steep straight line in the upper value range of state of charge SOC (first functional relationship) to derive operating parameters. In addition, it is proposed that the slopes of the straight lines shall be used as parameters for determining the operating parameters.

For example, a corrected state of charge value SOC, a corrected no-load voltage value $U_0$ and/or the acid capacity of the storage battery and/or the withdrawable charge may be determined as operating parameters under nominal conditions using the example method according to the present invention. For example, when installing a new battery in a vehicle, it is possible to recognize on the basis of the calculated acid capacity whether an incorrect battery size has been installed.

In addition, it may be advantageous to determine a third functional relationship between no-load voltage $U_0$ and state of charge SOC as the value for the withdrawable charge in relation to the nominal capacity of the storage battery in the state without electrolyte stratification. The discharge characteristic line described by the first and second functional relationships may then be analyzed in relation to the characteristic line of an unstratified battery, i.e., the third functional relationship.

A corrected state of charge value and/or corrected no-load voltage value of the storage battery is preferably ascertained as a function of the voltage offset and the slope of the straight lines (for describing the straight lines) for describing the first and second functional relationships.

The acid capacity of the storage battery is preferably determined as an operating parameter from the slope of a straight line for describing the first or second functional relationship, in particular from the respective active functional relationship. The acid capacity may be calculated in two different ways, namely either from the slope and voltage offset parameters that have been ascertained or from two no-load voltage values that have been measured, i.e., ascertained.

In both embodiments, the acid capacity may be ascertained from the slope of the straight line for describing the first functional relationship if the no-load voltage is greater than or equal to the no-load voltage at the point of intersection of the two straight line sections of the straight characteristic line expressed by the first and second functional relationships. Otherwise, if the no-load voltage is less than the no-load voltage at the point of intersection of the two straight line sections of the discharge characteristic line, the acid capacity is ascertained from the slope of the straight line for describing the second functional relationship.

The acid capacity may be ascertained by the second method from the measured or ascertained no-load voltage values, e.g., according to the equation:

$$C_{0,x} = (U_{0,1x} - U_{0,2x})/\text{charge conversion}$$

where $U_{0,1x}$ and $U_{0,2x}$ are ascertained as no-load voltage values $U_0$ on the characteristic line of either the first functional relationship (x=1) or the second functional relationship (x=2) and the charge conversion between the determination of two no-load voltage values $U_{0,1x}$ and $U_{0,2x}$.

It may also be advantageous if the operating parameters are ascertained as a function of temperature, i.e., the battery temperature or a temperature variable corresponding to the battery temperature.

The object may also be achieved by a system for ascertaining operating parameters of an electrochemical storage battery having means for determining the battery voltage and battery current and having a memory for saving the nominal capacity of the storage battery and by using a computer for executing the method described above. The computer may be designed as programmed microcontrollers of a motor vehicle, for example.

BRIEF DESCRIPTION OF THE DRAWINGS

The present invention is explained in greater detail below with reference to the accompanying figures.

DETAILED DESCRIPTION OF EXAMPLE EMBODIMENTS

Figure 1:
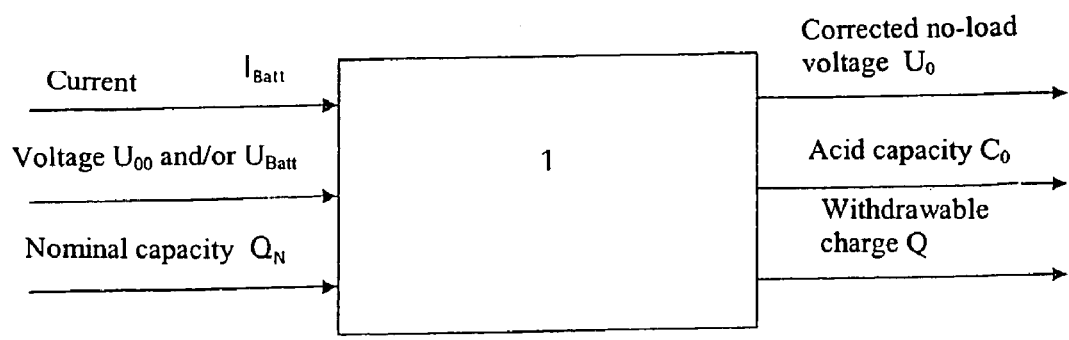
FIG. 1 shows a block diagram of a system for ascertaining the corrected no-load voltage, acid capacity, and withdrawable charge of an electrochemical storage battery using an example method according to the present invention.

FIG. 1 shows a block diagram of a system 1 for ascertaining a corrected no-load voltage $U_0$ and acid capacity $C_0$ of a storage battery as operating parameters and for ascertaining withdrawable charge Q, taking into account electrolyte stratification, from battery voltage $U_{Batt}$, battery current $I_{Batt}$, and nominal capacity $Q_N$ as measured quantities. To do so, the system has a measuring device for battery current $I_{Batt}$ and battery voltage $U_{Batt}$ as well as a memory for saving the value of nominal capacity $Q_N$ of the storage battery in a conventional way. The system itself may be implemented as a programmed microcontroller, for example.

No-load voltage $U_0$ and/or state of charge SOC is/are ascertained by the system with the help of a voltage offset $U_{Offset}$ and slope a of characteristic lines for describing a first or a second functional relationship between no-load voltage $U_0$ and state of charge SOC. State of charge SOC here is the value for charge Q still withdrawable from the storage battery in relation to nominal capacity $Q_N$. Acid capacity $C_0$ may be determined by two different methods, as explained in detail below. Firstly, acid capacity $C_0$ may be determined from the slope of the particular active discharge characteristic line of the storage battery having electrolyte stratification, i.e., according to the equation:

$$C_{0,x} = (S_U - UO_x X_{corr})/(S_{SOC} - SOCX_{corr})$$

using the active first or second functional relationship. Secondly, acid capacity $C_0$ may be determined by determining two no-load phases each on one part of the discharge characteristic line, i.e., using either the first or the second functional relationship according to the equation $$C_{0,kx} = U_{0,1x} - U_{0,2x}/\text{charge conversion}.$$

The first functional relationship where x=1 is selected here when no-load voltage $U_0$ is greater than or equal to no-load voltage $S_U$ at the point of intersection of the two characteristic lines of the first and second functional relationships. However, the second functional relationship where x=2 is selected if no-load voltage $U_0$ is less than no-load voltage $S_U$ at the point of intersection.

Figure 2:
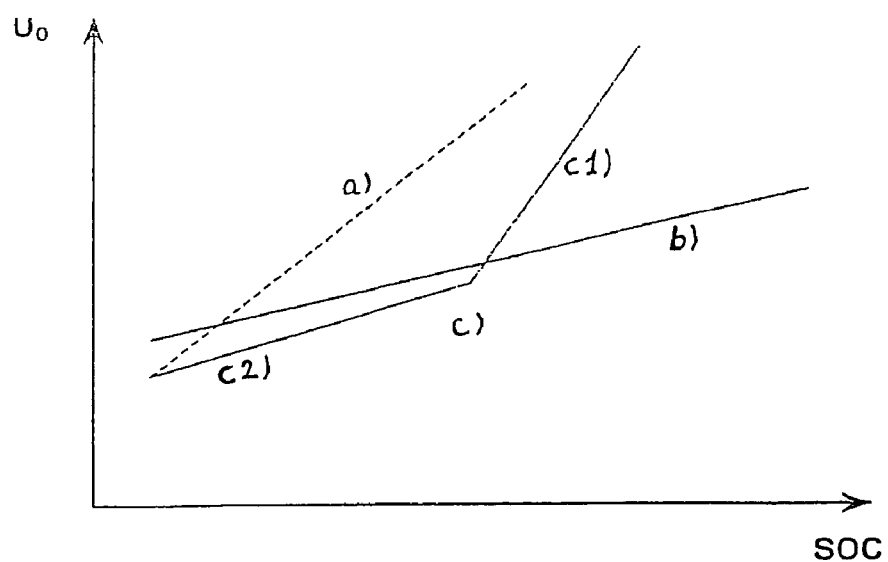
FIG. 2 shows characteristic line diagrams of the no-load voltages of an unstratified battery, a stratified battery while charging, and a stratified battery while discharging, plotted over the state of charge.

FIG. 2 shows a diagram of no-load voltage characteristic lines over state of charge SOC for the charge characteristic line of a stratified storage battery (characteristic line a)), an unstratified storage battery (characteristic line b)), and the discharge characteristic line of a stratified storage battery (characteristic line c)). Discharge characteristic line c) includes a first steep straight line section in the upper value range of state of charge SOC (first functional relationship, i.e., straight line c1) and a more gently inclined straight line section in the lower value range of state of charge SOC (second functional relationship, i.e., straight line c2).

The example method according to the present invention is thus one wherein discharge characteristic line c) is divided into two straight line parts of different slopes c1, c2 in the model analysis and also in the measurements. This may be explained physically as follows.

The electrolyte of a storage battery may be divided roughly into two areas. The first area is formed by the electrolyte over the plate that does not take part in the reaction. The second area is determined by a middle electrolyte area, whose electrolyte influences the second straight line in the lower value range of state of charge SOC. The third area is determined by a lower electrolyte area, which influences the upper steeper straight line c1 of the discharge characteristic line. The lower electrolyte area is smaller than the middle electrolyte area. The transition from the smaller to the larger quantity of electrolyte is not regarded as fluid, as it is in reality, but instead is assumed to occur at a certain point in time. In the model analysis, this is the point of intersection of the two straight line sections of the discharge characteristic line. In a stratified storage battery, the lower plate part having a higher concentration of acid is discharged to a greater extent and is charged to a lesser extent. This is determined for no-load voltage $U_0$.

Using the example method according to the present invention, operating parameters of the electrochemical storage battery are ascertained from the point of intersection of the two straight line sections of the discharge characteristic line, which changes with an increase in electrolyte stratification, from the slopes of the straight line sections as a function of the total charge conversion (straight line c2) and from the charge conversion since the last no-load phase or full charge (straight line c1).

State of charge value SOC and/or no-load voltage $U_0$ in no-load phases may be corrected and the acid capacity may be determined by the slope, which changes as a function of the acid capacity, and the shift in the point of intersection of the discharge characteristic line with a change in the degree of stratification. For the analysis of electrolyte stratification, the stratified storage battery is divided like a model into three layers having different acid densities and electrolyte quantities:

a) an upper layer whose electrolyte does not take part in the reactions;

b) a middle layer whose electrolyte quantity and acid density have an influence on more gently sloped straight line c2) in the lower value range of state of charge SOC of the discharge characteristic line;

c) a lower layer whose electrolyte quantity and acid density have an influence on the steeper straight line c1) in the upper value range of state of charge SOC of the discharge characteristic line.

In addition, a distinction is made between the total charge conversion and the charge conversion since the last longer no-load phase or full charge because a different section of the straight line of the discharge characteristic line is influenced in each case. The total charge conversion has a significant influence on straight line c2), i.e., the second functional relationship. Straight line c1) of the discharge characteristic line, i.e., the first functional relationship, is influenced by the charge throughput since the last precharging or longer no-load phase.

Both straight line sections c1) and c2) of the discharge characteristic line are influenced by a full charge. There is an equalization of the acid density on the basis of gassing. The acid density in the lower part of the storage battery thus becomes lower and the quantity of acid becomes smaller. The no-load voltage declines. The first functional relationship (straight line section c1) of discharge characteristic line c) is influenced by a decline in acid concentration and electrolyte volume in the lower part of the storage battery and thus also straight line section c2) (second functional relationship) because there is a greater charge in the middle electrolyte area.

The recharging operations that take place in the no-load phases cause an equalization of concentration in the acid. This means that the straight line section c1) as well as straight line section c2) of discharge characteristic line c) are both influenced. The lower plate part is thus further discharged. This may result in the lower plate part no longer being able to take part in the reaction. This in turn means that the electrolyte quantity in the middle part of the plate is decreased.

Figure 3:
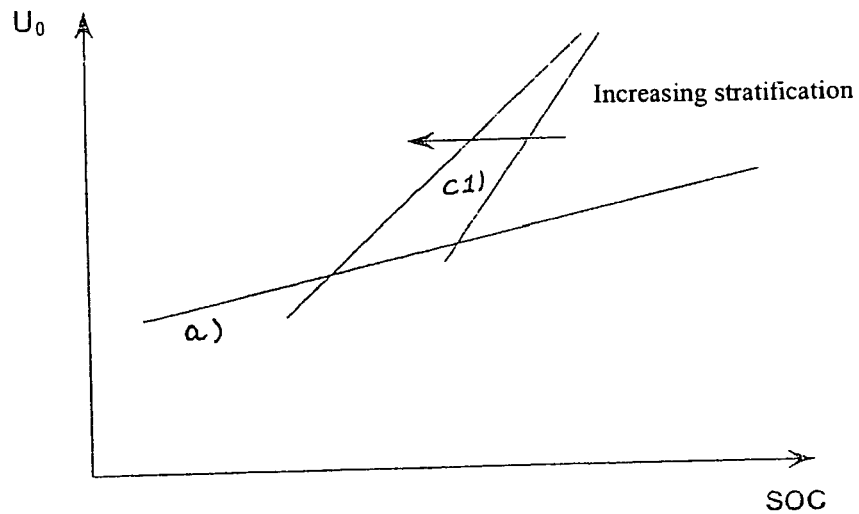
FIG. 3 shows characteristic line diagrams of the no-load voltages of an unstratified battery and a stratified battery while discharging, plotted over the state of charge, in the upper value range of the state of charge as a first functional relationship and with a shift in the characteristic line with an increase in electrolyte stratification.

FIG. 3 shows a diagram of straight line section c1) of discharge characteristic line c) and characteristic line a) of an unstratified storage battery as no-load voltage $U_0$ plotted over state of charge SOC. Straight line section c1) describing the first functional relationship between no-load voltage $U_0$ and state of charge SOC of the stratified storage battery is determined by the density and the quantity of the lower electrolyte area. The density and quantity of the lower electrolyte area increase with an increase in electrolyte stratification, i.e., with the charge conversion since the last full charge or longer no-load phase. With an increase in acid density, characteristic line c) and thus the point of intersection with straight line c2) describing the second functional relationship are shifted to the left. With an increase in the quantity of electrolyte, the slope of straight line sections c1) and c2) becomes more gentle and the point of intersection is shifted farther to the left.

A steep rise in straight line 1 describing the first functional relationship suggests a low degree of stratification which is to be expected after a low charge conversion, a full charge or a longer no-load phase.

A gentle rise, however, suggests a greater stratification.

Figure 4:
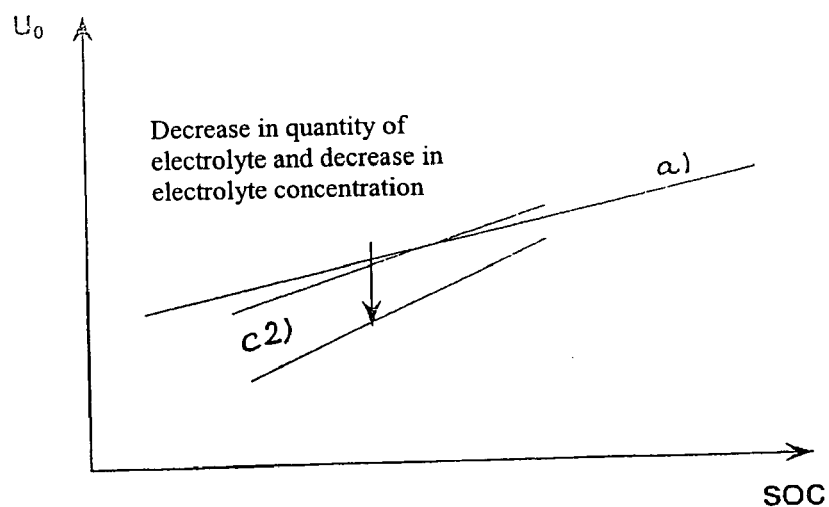
FIG. 4 shows a characteristic line diagram as the no-load voltage of an unstratified battery and a stratified battery while discharging, plotted over the state of charge, in the lower value range of the state of charge as a second functional relationship and with a shift in the characteristic line with an increase in electrolyte stratification.

FIG. 4 shows characteristic line a) of an unstratified storage battery and straight line section c2) which describes the second functional relationship between no-load voltage $U_0$ and state of charge SOC of the stratified storage battery as a discharge characteristic line.

The change in straight line section c2) is determined by the loss of usable electrolyte, which is triggered by low state of charge SOC in the lower plate area. A smaller quantity of electrolyte produces a steeper characteristic line of straight line section c2). The resulting lower acid density in the layer produces a downward shift in straight line section c2). The unusable electrolyte above the plate, which is no longer usable because of its lower density, reduces the usable quantity of electrolyte in the area of straight line section c2). After a short operating time, this electrolyte area is constant, resulting in a slight rise in the slope at the start of the operating time. Due to the slight increase in concentration of usable electrolyte, no-load voltage $U_0$ is increased somewhat in upper charge area SOC.

The usable electrolyte quantity and electrolyte concentration may be increased again by a full charge and longer no-load phases with subsequent charging. A gentle rise in straight line section c2) approximately reflects the increase in the rise at the start of the operating time and a steep rise reflects further loss of electrolyte due to the discharging lower plate area.

Figure 5:
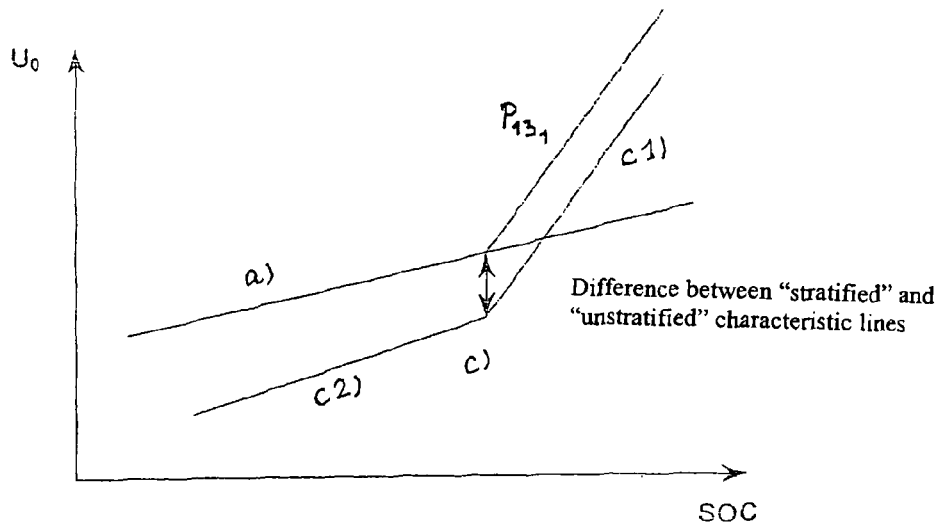
FIG. 5 shows a characteristic line diagram of an unstratified battery and a stratified battery while discharging as a no-load voltage, plotted over the state of charge, and a diagram of the voltage offset for the first functional relationship.

FIG. 5 shows characteristic line a) of an unstratified storage battery and discharge characteristic line c), each as functional relationships between no-load voltage $U_0$ and state of charge SOC.

It is clear that a downward shift in straight line section c2) due to a decrease in electrolyte quantity and a decrease in electrolyte concentration causes the shift in no-load voltage offset $U_{0,Offset}$ of upper straight line section c1). This no-load voltage offset $U_{0,Offset}$ is corrected by standardizing straight line section c1) to the characteristic line of an unstratified storage battery. The difference between the point of intersection of straight line section c1) and straight line section c2) of the discharge characteristic line with the characteristic line of the unstratified storage battery is ascertained.

Figure 6:
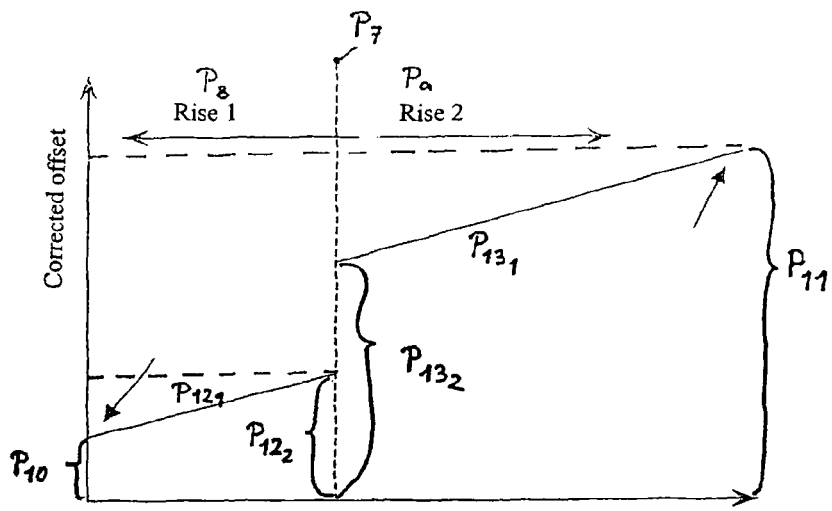
FIG. 6 shows a diagram of the corrected no-load voltage offset of the first functional relationship, plotted over the charge conversion since the last full charge or longer no-load phase.
Figure 8:
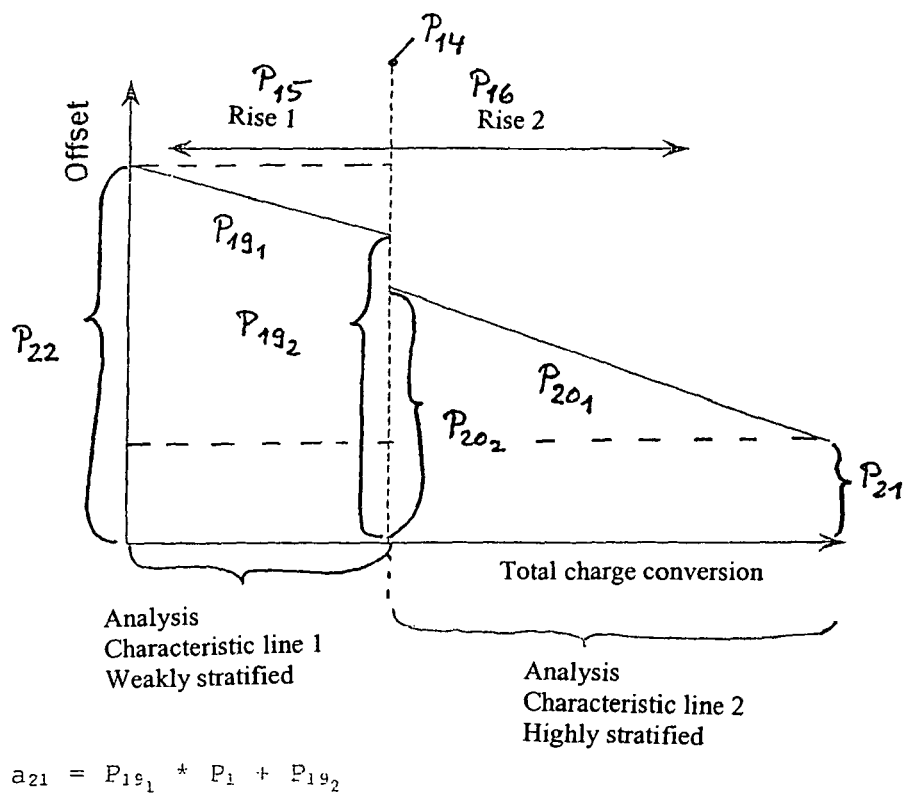
FIG. 8 shows a diagram of the no-load voltage offset of the second functional relationship, plotted over the total charge conversion.

The characteristic lines for determining offset $a_{21}$, $a_{22}$ of the second functional relationship and/or $a_1$ of the first functional relationship are produced as follows, as illustrated in FIGS. 6 and 8:

1) Determining a minimum offset value $P_{10}$, $P_{21}$ and a maximum offset value $P_{11}$, $P_{22}$.

The minimum offset value is the maximum offset by which the characteristic line may be pushed back due to full charging and a no-load phase.

The maximum offset value is the maximum offset by which the characteristic line may be shifted due to stratification.

2) Determining offset values $P12_2$, $P13_2$ and/or $P19_2$, $P20_2$

Figure 7:
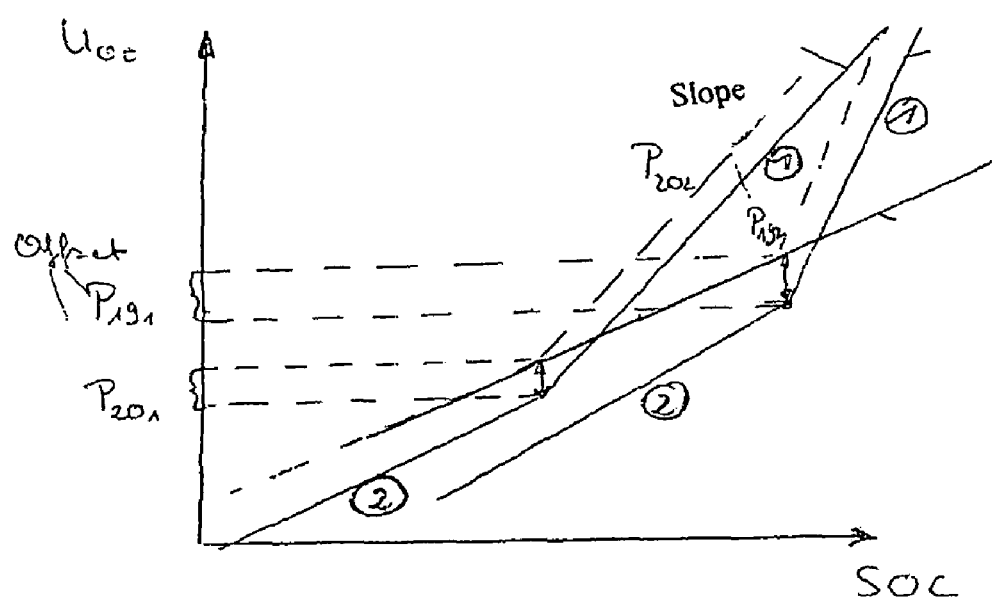
FIG. 7 shows a line diagram of a stratified battery and an unstratified battery while discharging as a no-load voltage, plotted over the state of charge, and a diagram of the offset for the second functional relationship.

As illustrated in FIGS. 5 and 7, the characteristic lines are standardized to the characteristic line without stratification. To do so, the difference between the point of intersection of the first and second characteristic lines and the unstratified characteristic line is added to the offset.

3) Particular slope $P12_1$, $P13_1$ and/or $P19_1$, $P20_1$ is then derived from the diagram according to FIGS. 6 and 8.

For the first functional relationship, there is a relationship between the corrected offset and the charge throughput since the last full charge or longer no-load phase. For the second functional relationship, the corrected offset is plotted over the total charge throughput.

For the total discharge characteristic line, it then holds:

Straight line section c1): $U_0 = a_1 - b_1 * SOC$

Straight line section c2): $U_0 = a_2 - b_2 * SOC$

With measured no-load voltage $U_0$, state of charge value SOC, offset [mV] $a_1$ and $a_2$ and slope [mV/%] $b_1$ and $b_2$. Straight line section c1) represents the first functional relationship and straight line section c2) represents the second functional relationship.

The point of intersection of two straight line sections c1) and c2) is then calculated as follows:

$S_{SOC} = (a_1 - a_2)/(b_1 - b_2)$ $S_U = a_1 + b_1 * (a_2 - a_1)/(b_1 - b_2)$, where $S_{SOC}$ is state of charge value SOC at the point of intersection of first and second straight line sections c1), c2) and $S_U$ is no-load voltage value $U_0$ at the point of intersection of first and second straight line sections c1), c2).

In ascertaining the operating parameters, the first or second functional relationship is taken into account, depending on no-load voltage $U_0$.

If no-load voltage $U_0$ is greater than or equal to no-load voltage value $S_U$ at the point of intersection, then the first functional relationship is used.

If no-load voltage $U_0$ is less than no-load voltage $S_U$ at the point of intersection of the first and second straight line sections, then the second functional relationship is used.

A correction is then performed in the course due to the charge conversions which are calculated continuously.

Straight line section c1) may be described by the following parameters:

First functional relationship:

$U_0 = a_1 + b_1 * SOC$ where $b_1$ = constant (only one slope $b_1$ is assumed but it may also be variable for more complex analyses).

$a_1 = P13_1 * P_1 + P13_2$ (in the range of minimum offset $P10$ and maximum offset $P_{11}$)

$P13_1$: slope ([V])
$P13_2$: offset ([V])
$P_2$: charge conversion since the last full charge or longer no-load phase in the area $[0, P_{1max}]$
$P_{10}$: minimum offset $U_{0,Offset-min}$
$P_{11}$: maximum offset $U_{0,Offset-max}$ Straight line section c2) describing the second functional relationship may be defined by the following parameters:

Second functional relationship:

$U_0 = a_2 + b_2 * SOC$ and/or $U_0 = a_{21} + b_{21} * SOC$ where:

$b_{21}$ and $b_{22}$ = constant (only one constant slope is assumed, but the factor may be variable for more complex relationships)

$a_{21} = P19_1 * P2 + P19_2$ (in the range between minimum and maximum offset $[P_{21}, P_{22}]$)

$a_{22} = P20_1 * P2 + P20_2$ (in the range between minimum and maximum offset $[P_{21}, P_{22}]$)

$P19_1$: slope/rise 1 ([V])
$P19_2$: offset/rise 1 ([V])
$P20_1$: slope/rise 2 ([V])
$P20_2$: offset/rise 2 ([V])
$P_2$: total charge throughput $(0, P_{2Max})$
$P_{21}$: minimum no-load voltage offset $U_{0,Offset-min}$
$p22$: maximum no-load voltage offset $U_{0,Offset-max}$ The total relationship between no-load voltage $U_0$ and state of charge SOC is thus described by two straight lines:

Characteristic line 1: $U_0 = a_1 + b_1 * SOC$

Characteristic line 2: $U_0 = a_2 + b_2 * SOC$.

The switch between characteristic lines takes place at the point of intersection . . . characteristic lines ground state value:

$S_{SOC} = (a_2 - a_1)/(b_1 - b_2)$ $S_U = a_1 + b_1 * (a_2 - a_1)/(b_1 - b_2)$.

The following conditions then hold for the switch:

$U_0 \geq S_U \rightarrow$ use characteristic line 1

$U_0 \geq S_U \rightarrow$ use characteristic line 2.

The acid capacity may be ascertained from this by $$C_{0,1} = \frac{S_U - U_{0,1}}{S_{SOC} - SOC_{gem,1}} \rightarrow \text{characteristic line 1}$$

$$C_{0,2} = \frac{S_U - U_{0,2}}{S_{SOC} - SOC_{gem,2}} \rightarrow \text{characteristic line 2}$$

where
$S_U$: voltage value at the point of intersection
$U_{0,1}$: corrected no-load voltage on characteristic line 1
$S_{SOC}$: ground state value SOC of point of intersection
$SOC_{gem,1}$: state of charge value SOC determined on characteristic line 1

If two no-load voltage points and $U_{0,1x}$, $U_{0,2x}$ and the charge conversion between the no-load phases on straight line section c1), i.e., in the first functional relationship, are known, prevailing acid capacity $C_{0,x}$ of the storage battery may be determined and from that the actual capacity of the storage battery may be determined by using the equations:

$$C_{0,1} = \frac{U_{0,12} - U_{0,22}}{\text{charge conversion}} \rightarrow \text{characteristic line 2}$$

$$C_{0,1} = \frac{U_{0,11} - U_{0,21}}{\text{charge conversion}} \rightarrow \text{characteristic line 1.}$$

What is claimed is:

1. A method for ascertaining operating parameters of an electrochemical storage battery, taking into account electrolyte stratification, the method comprising:
   determining a first functional relationship between a no-load voltage and a state of charge as a value for a withdrawable charge in relation to a nominal capacity of the storage battery, obtained in a state having electrolyte stratification in a discharge phase using a charge conversion since one of a prior no-load phase or a prior full charge;
   determining a second functional relationship between the no-load voltage and the state of charge as a value for the withdrawable charge in relation to the nominal capacity of the storage battery, obtained in a state having electrolyte stratification in a discharge phase using an accumulated charge conversion;
   ascertaining operating parameters from at least one of: i) a point of intersection of the first functional relationship and the second functional relationship, slopes of straight lines for describing at least one of the first functional relationship and the second functional relationship, and ii) two particular no-load voltage values and a charge throughput between the no-load voltage values;
   determining a functional relationship between the no-load voltage and the state of charge as the value for the withdrawable charge in relation to the nominal capacity of the storage battery in a state without electrolyte stratification; and
   determining a voltage offset and a slope for the first functional relationship and the second functional relationship between the point of intersection of the first functional relationship and the second functional relationship and the first functional relationship in the state without electrolyte stratification.

2. The method as recited in claim 1, further comprising:
   ascertaining the voltage offset as a function of a charge conversion, stratification-dependent voltage offset and slope.

3. The method as recited in claim 2, wherein the charge conversion is a total charge conversion.

4. The method as recited in claim 2, wherein the charge conversion is a charge conversion after one of a no-load phase or a full charge.

5. The method as recited in claim 1, further comprising:
   ascertaining, as a function of a voltage offset and the slope of the straight lines for describing the second functional relationship having electrolyte stratification, at least one of a corrected state of the charge value and the no-load voltage value of the storage battery.

6. The method as recited in claim 1, further comprising:
   ascertaining an acid capacity of the storage battery as an operating parameter from the slope of the straight line for describing the at least one of the first functional relationship and the second functional relationship.

7. The method as recited in claim 6, wherein the ascertaining of the acid capacity includes ascertaining the acid capacity from one of a particular active first functional relationship or a particular active second functional relationship.

8. The method as recited in claim 7, wherein the ascertaining of the acid capacity includes ascertaining the acid capacity from the slope of the straight lines for describing the first functional relationship if the no-load voltage is greater than or equal to a no-load voltage at the point of intersection of the straight lines for describing the first functional relationship and the second functional relationship, and ascertaining the acid capacity from the slope of the straight lines for describing the second functional relationship when the no-load voltage is less than the no-load voltage at the point of intersection of the straight lines for describing the first functional relationship and the second functional relationship.

9. The method as recited in claim 8, wherein the ascertaining of the acid capacity includes ascertaining the acid capacity according to an equation:

$$c_{ox} = (U_{OX} - S_{UX})/(SOC_X - S_{SOCX})$$

wherein $U_{OX}$ is the no-load voltage value on the characteristic line of one of the first functional relationship or the second functional relationship, $S_{U,X}$ is the no-load voltage value at the point of intersection of the first and second straight line sections, $SOC_X$ is a state of the charge value on a characteristic line of either the first functional relationship or the second functional relationship, and $S_{SOC,X}$ is the state of the charge value at the point of intersection of the first and second straight line sections of the two characteristic lines of the first and second functional relationships.

10. The method as recited in claim 7, wherein the ascertaining of the acid capacity includes ascertaining the acid capacity according to an equation.

$$C_{0,x} = (U_{0,1x} - U_{0,2x})/(\text{charge conversion}).$$

wherein $U_{0,1x}$ and $U_{0,2x}$ are two no-load voltage values on a characteristic line of either the first functional relationship or second functional relationship and a charge conversion between a determination of no-load voltage values $U_{0,1x}$ and $U_{0,2x}$.

11. The method as recited in claim 1, further comprising:
   ascertaining the withdrawable charge at the nominal capacity of the storage battery.

12. The method as recited in claim 1, further comprising:
   ascertaining the operating parameters as a function of temperature.

13. A system for ascertaining operating parameters of an electrochemical storage battery, comprising:
- an arrangement configured to determine at least one of a battery voltage and a battery current;
- a memory for saving nominal capacity configured of the storage battery; and
- a computer configured to perform the steps of:
- determining a first functional relationship between a no-load voltage and a state of charge as a value for a withdrawable charge in relation to a nominal capacity of the storage battery, obtained in a state having electrolyte stratification in a discharge phase using a charge conversion since one of a prior no-load phase or a prior full charge;
- determining a second functional relationship between the no-load voltage and the state of charge as a value for the withdrawable charge in relation to nominal capacity of the storage battery, obtained in a state having electrolyte stratification in a discharge phase using an accumulated charge conversion;
- ascertaining operating parameters from at least one of: i) a point of intersection of the first functional relationship and the second functional relationship, slopes of straight lines for describing at least one of the first functional relationship and the second functional relationship, and ii) two particular no-load voltage values and a charge throughput between the no-load voltage values;
- determining a functional relationship between the no-load voltage and the state of charge as the value for the withdrawable charge in relation to the nominal capacity of the storage battery in a state without electrolyte stratification; and
- determining a voltage offset and a slope for the first functional relationship and the second functional relationship between the point of intersection of the first functional relationship and the second functional relationship and the first functional relationship in the state without electrolyte stratification.

* * * * *